US008319671B2

(12) United States Patent
Chen

(10) Patent No.: US 8,319,671 B2
(45) Date of Patent: Nov. 27, 2012

(54) KEYPAD STRUCTURE

(75) Inventor: Chao Chen, Waterloo (CA)

(73) Assignee: Research In Motion Limited, Waterloo, Ontario (CA)

( * ) Notice: Subject to any disclaimer, the term of this patent is extended or adjusted under 35 U.S.C. 154(b) by 518 days.

(21) Appl. No.: 12/609,502

(22) Filed: Oct. 30, 2009

(65) Prior Publication Data

US 2011/0102205 A1 May 5, 2011

(51) Int. Cl.
*H03M 11/00* (2006.01)

(52) U.S. Cl. ................ 341/27; 341/22; 341/31; 341/32; 341/33; 341/34; 345/156; 345/161; 345/163; 345/167; 345/173

(58) Field of Classification Search .............. 341/22–27; 345/156, 161, 163, 167–169, 173
See application file for complete search history.

(56) References Cited

U.S. PATENT DOCUMENTS

| | | | | |
|---|---|---|---|---|
| 7,106,305 | B2 | 9/2006 | Rosenberg | |
| 7,336,260 | B2 * | 2/2008 | Martin et al. | 345/169 |
| 7,468,573 | B2 | 12/2008 | Dai et al. | |
| 7,869,589 | B2 * | 1/2011 | Tuovinen | 379/433.07 |
| 8,094,806 | B2 * | 1/2012 | Levy | 379/368 |
| 8,125,355 | B2 * | 2/2012 | Soderlund | 341/22 |
| 2002/0084721 | A1 * | 7/2002 | Walczak | 310/339 |
| 2003/0122779 | A1 * | 7/2003 | Martin et al. | 345/156 |
| 2005/0237306 | A1 * | 10/2005 | Klein et al. | 345/168 |
| 2006/0052143 | A9 | 3/2006 | Tuovinen | |
| 2007/0080951 | A1 | 4/2007 | Maruyama et al. | |
| 2007/0229455 | A1 * | 10/2007 | Martin et al. | 345/156 |
| 2007/0256915 | A1 * | 11/2007 | Levy | 200/5 A |
| 2008/0100568 | A1 | 5/2008 | Koch et al. | |
| 2008/0251364 | A1 * | 10/2008 | Takala et al. | 200/341 |
| 2009/0072662 | A1 * | 3/2009 | Sadler et al. | 310/319 |
| 2009/0091479 | A1 | 4/2009 | Sinha | |
| 2009/0277767 | A1 * | 11/2009 | Cheng et al. | 200/512 |

FOREIGN PATENT DOCUMENTS

| | | |
|---|---|---|
| EP | 1727173 | 11/2006 |
| EP | 2075672 | 7/2009 |

OTHER PUBLICATIONS http://www.schurter.ch/products/product_news.asp?sge=input_systems&language_id=10.
Extended European Search Report, Feb. 5, 2010, European Patent Application No. 09174641.2.

* cited by examiner

*Primary Examiner* — Linh Nguyen

(57) ABSTRACT

A keypad structure comprises a plurality of dome switches. Each of the plurality of dome switches provides a first tactile feedback to a user when pressed. At least one vibratory element is electrically connected to the dome switches to actuate when one of the plurality of dome switches is pressed. The at least one vibratory element provides a second tactile feedback to the user.

17 Claims, 7 Drawing Sheets

KEYPAD STRUCTURE

FIELD

This application relates to a keypad structure, and more particularly, to a keypad for an electronic device.

BACKGROUND

Electronic devices such as cellular phones, personal digital assistants and laptop computers typically incorporate a keypad structure which allows the user to interface with the electronic device. The keypad structure may perform two functions. The first is to recognize that a key has been pressed by the user and to communicate this operation by the user to the electronic device. The second is to provide tactile feedback to the user so that the user will know that the electronic device has registered that the key has been pressed. The provision of tactile feedback to the user is important since otherwise, the user may repeatedly press a key believing that the electronic device has not registered that the key has been pressed when in fact the electronic device has already recognized that the key has been pressed.

One type of switch used with some electronic devices, such as cellular phones, is a dome type switch. A dome type switch will perform both functions noted above. In particular, the dome type switch when pressed will signal to the electronic device that the key has been pressed. The dome type switch also provides tactile feedback to the user. However, the tactile feedback provided by a dome type switch can be very low, especially when the distance between the keys is very small, for example, in a cellular telephone with a QWERTY film style keypad provided in a limited space.

BRIEF DESCRIPTION OF THE DRAWINGS

The embodiments will now be described in greater detail with reference to the accompanying diagrams, in which.

DETAILED DESCRIPTION OF THE PREFERRED EMBODIMENTS

Figure 1A:
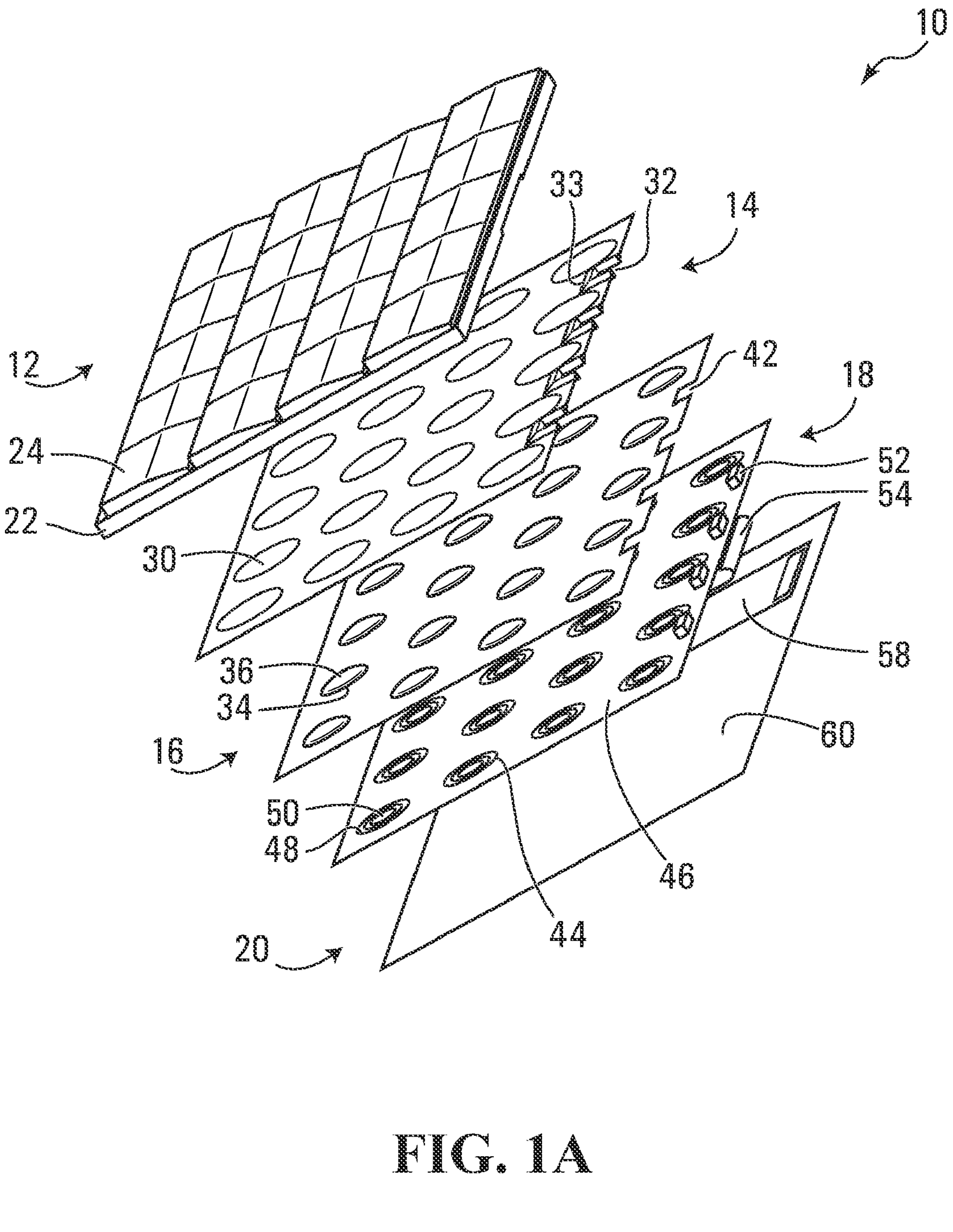
FIG. 1A is an exploded top perspective view of a keypad structure according to an embodiment.

According to a broad aspect, there is provided a keypad structure comprising: a plurality of dome switches, each of the plurality of dome switches providing a first tactile feedback to a user when pressed; and at least one vibratory element electrically connected to the plurality of dome switches and configured to actuate when any one of the plurality of dome switches is pressed, the at least one vibratory element providing a second tactile feedback to the user.

In some embodiments, the keypad structure further comprises a second plurality of dome switches and at least one second vibratory element electrically connected to the second plurality of dome switches, wherein each of the second plurality of dome switches provides the first tactile feedback to the user when pressed; and wherein the at least one second vibratory element is configured to actuate when one of the second plurality of dome switches is pressed, the at least one second vibratory element providing the second tactile feedback to the user.

In some embodiments the plurality of dome switches comprises a dome sheet and a circuit board and the circuit board interconnects the plurality of dome switches to the at least one vibratory element.

In some embodiments the keypad structure further comprises an input keypad surface connected to the plurality of dome switches.

In some embodiments the input keypad surface comprises a film type keypad surface.

In some embodiments the film type keypad surface comprises keycaps.

In some embodiments the at least one vibratory element comprises a metal sheet and ceramic piezoelectric actuators.

In some embodiments the metal sheet comprises a structural component of the keypad structure.

In some embodiments the structural component comprises a keypad back.

In some embodiments the at least one vibratory element comprises at least one vibration motor.

According to another broad aspect, a handheld electronic device comprises a keypad structure, and the keypad structure comprises: a plurality of dome switches, each of the plurality of dome switches providing a first tactile feedback to a user when pressed; and at least one vibratory element electrically connected to the plurality of dome switches and configured to actuate when any one of the plurality of dome switches is pressed, the at least one vibratory element providing a second tactile feedback to the user.

In some embodiments of the handheld electronic device, the keypad structure further comprises: a second plurality of dome switches, each of the second plurality of dome switches providing the first tactile feedback to the user when pressed; at least one second vibratory element electrically connected to the second plurality of dome switches and configured to actuate when one of the second plurality of dome switches is pressed, the at least one second vibratory element providing the second tactile feedback to the user.

According to another broad aspect, there is provided a method of providing tactile feedback to a user of a keypad structure comprising: providing a first tactile feedback to a user when each of a plurality of dome switches is pressed; sending a signal to at least one vibratory element; and the at least one vibratory element actuating upon receipt of the signal to provide a second tactile feedback to the user.

In some embodiments, the at least one vibratory element comprises at least one first vibratory element and at least one second vibratory element and the plurality of dome switches comprises a first plurality of dome switches and a second plurality of dome switches, the method further comprising sending the signal to the at least one first vibratory element to actuate when any of the first plurality of dome switches is pressed, and sending the signal to the at least one second vibratory element when any of the second plurality of dome switches is pressed.

In some embodiments, the plurality of dome switches comprises a dome sheet and a circuit board and the circuit board sends the signal from the dome switches to the at least one vibratory element.

In some embodiments, the tactile feedback is provided through an input keypad surface connected to the dome switches.

Other aspects and features of the present application will become apparent, to those ordinarily skilled in the art, upon review of the following description of the specific embodiments.

Figure 1B:
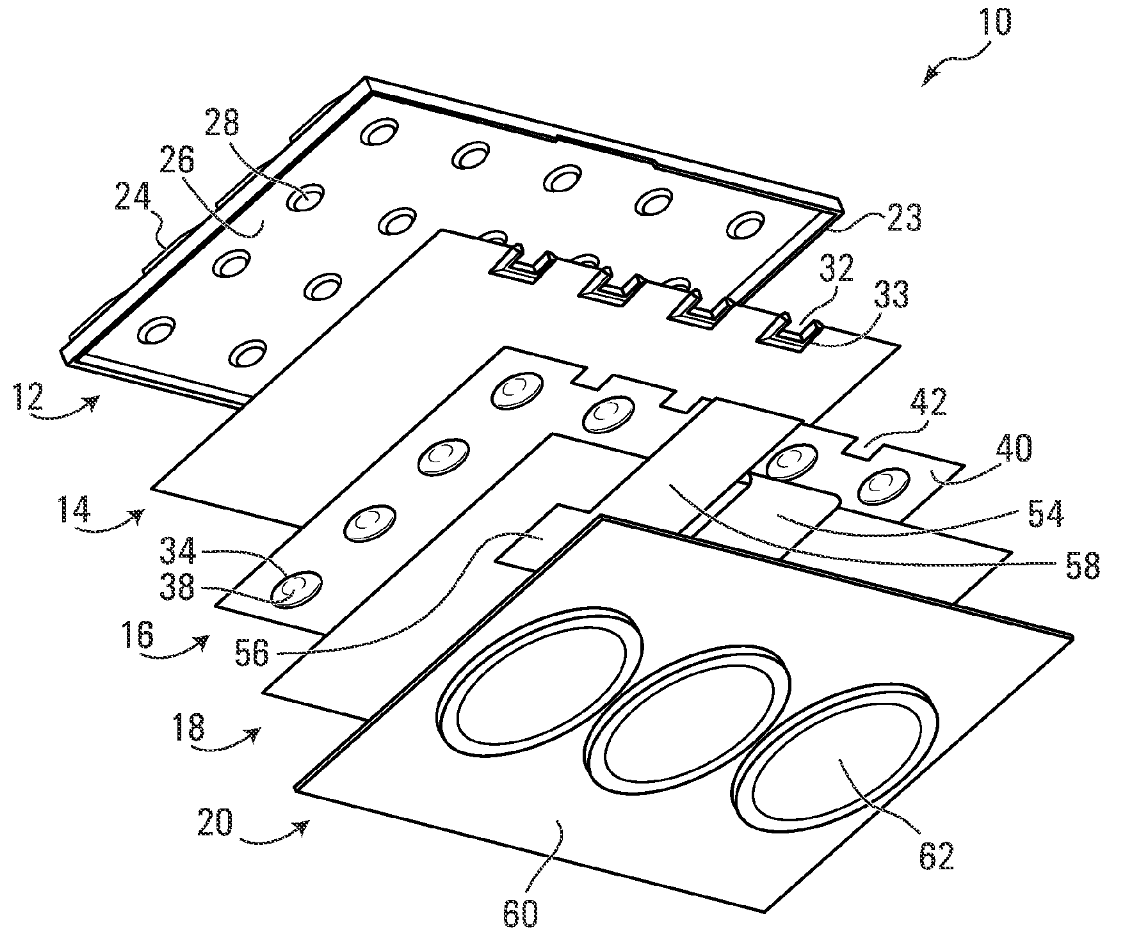
FIG. 1B is a bottom exploded perspective view of a keypad structure of FIG. 1A.

FIGS. 1A and 1B show the layers which make up a keypad structure 10. The keypad structure 10 of this embodiment includes, in sequence from top to bottom, a keypad layer 12, a lightguide layer 14, a dome layer 16, a flexible printed circuit (FPC) layer 18 and a piezoelectric layer or vibratory element 20.

In this embodiment, the keypad layer 12 is the outermost layer and is a flat sheet which incorporates a film style keypad sheet 22. The film style keypad sheet 22 forms an input keypad surface. The film style keypad sheet 22 may be a continuous layer of flexible sheet material with an encircling flange 23 to help prevent contaminants from entering the keypad structure 10 of the electronic device. An outer surface of the film style keypad sheet 22 may incorporate hard keycaps 24. The array of hard keycaps 24 shown in FIGS. 1A and 1B is not a complete QWERTY keypad. However, it will be understood that the keypad may be a full QWERTY keypad, although alternate keyboard arrangements may be suitable, such as, but not limited to, QWERTZ, AZERTY and Dvorak keyboard arrangements. The hard keycaps 24 may be replaced with soft keycaps. The hard keycaps 24 may be omitted and the film style keypad sheet 22 used without the keycaps. The film style keypad sheet 22 may also be omitted.

Turning to FIG. 1B, an inner side 26 of the film style keypad sheet 22 may incorporate an array of actuators 28. In this embodiment, the actuators 28 are circles which project inward from the inner side 26 of the film style keypad sheet 22 (i.e., away from the hard keycaps 24 of the keypad layer 12). The actuators 28 may, for example, comprise a thickened layer of the film style keypad sheet 22. In other embodiments, the actuators 28 may comprise other materials fastened to the film style keypad sheet 22. They may also be of differing shapes.

In this embodiment, each of the actuators 28 is aligned below a corresponding hard keycap 24 such that when one of the hard keycaps 24 is pressed by the user, the film style keypad 22 flexes inward and the actuator 28 moves inward. The movement of the actuators 28 facilitates the operation of the domes as will be discussed further below. It will be appreciated that the actuators 28 may be omitted.

The lightguide layer 14 of this embodiment is another flexible flat film layer. The lightguide layer 14 may include micro-optical features 30 which help to disburse light which shines through the lightguide layer 14. The micro-optical features 30 of this embodiment are provided in an array of circles aligned with the hard keycaps 24 and the actuators 28. In other embodiments, the micro-optical features 30 may be dispersed uniformly or in a different array.

In this embodiment, the lightguide layer 14 also defines four cutouts 32. The four cutouts 32 allow the light-emitting diodes (LEDs) to be positioned to direct light into the lightguide layer 14. Each of the four cutouts 32 of this embodiment is optionally bordered by a light director 33. The light directors 33 help to direct light from the LEDs into the lightguide layer 14. The number, positioning and shape of the cutouts may be varied depending on the type and number of LEDs or other light sources used.

The lightguide layer 14 allows the keypad structure 10 to be backlit. This may be useful, for example, if the keypad structure 10 contains numbers, letters or designs which may be seen more clearly when backlit. However, the lightguide layer 14 may be omitted and the keypad structure 10 not backlit or another means of lighting may be present. For example, the lightguiding feature may be incorporated into the dome layer 16 if the lightguide layer 14 is omitted.

The dome layer 16 of this embodiment is a flat layer with an inner planer surface 40 and an array of domes 34. Each of the domes 34 projects outward, in other words, is curved outward towards the hard keycaps 24 of the keypad structure 10. The domes 34 include a convex outer surface 36 and a concave inner surface 38. The inner surface 38 is at least partially coated with a conductive material such as carbon, although other materials with similar properties may be appropriate. The remainder of the dome layer 16 may be non-conductive or at least the inner planer surface 40 may be non-conductive. In this embodiment, the domes 34 are each flexible. The entire dome layer 16 of this embodiment is flexible but the dome layer 16 may alternatively be inflexible and only the domes 34 may move when pressed.

From the perspective of FIGS. 1A and 1B, the domes 34 project in a direction opposite to the direction in which the actuators 28 project. In this embodiment, each of the domes 34 is arrayed under a corresponding actuator 28 and hard keycap 24.

The dome layer 16 of this embodiment also defines four cutouts 42 along an edge aligned with the cutouts 32 of the lightguide layer 14, also for accommodating LEDs or other light sources.

The flexible printed circuit (FPC) layer 18 underlies the dome layer 16 in this embodiment. The FPC layer 18 includes an array of contact pads 44 on an outer surface 46. In this embodiment, the contact pads 44 include an outer ring 48 and an inner circle 50. The outer ring 48 and the inner circle 50 are conductive but are not electrically connected to each other. Other geometries of contact pads may also be used. Each of the contact pads 44 are aligned with a corresponding dome 34 on the dome layer 16.

The domes 34 and the contact pads 44 together form a plurality of dome switches. In particular, when the domes 34 are not pressed, the switches are open. When one of the domes 34 is pressed, the dome 34 collapses and the conductive inner surface 38 of the dome 34 touches the corresponding contact pad 44. The conductive inner surface 38 provides a conductive bridge between the outer ring 48 and the inner circle 50 of that contact pad 44. This completes a circuit and closes that dome switch. Other shapes and types of switch structures may be used.

In this embodiment, the FPC layer 18 also includes a number of light-emitting diodes (LEDs) 52. In this embodiment, four LEDs 52 are depicted. The LEDs 52 are spaced along an edge of the FPC layer 18 aligned with the cutouts 32 and 42 so that when the keypad structure 10 is assembled the LEDs 52 are aligned with the cutouts 32 to project light into the lightguide layer 14. The LEDs 52 may be replaced with other light emitting elements, may be moved or may be eliminated if the lightguide layer 14 is eliminated.

The FPC layer 18 also includes circuitry (not shown) which connects the LEDs 52 and the contact pads 44 to other circuitry. In particular, the FPC layer 18 in this embodiment includes a connection portion 54. The connection portion 54 is an extension of the FPC layer 18 which is bent around the back of the keypad structure 10 and provides circuitry for the interconnection to the piezoelectric layer 20 and other circuitry of the electronic device such as a main printed circuit board (PCB). The connection portion 54 in this embodiment includes an arm 56 and an extension 58. The arm 56 extends out along the back of the keypad structure perpendicular to the connection portion 54 and the extension 58 (see FIG. 2A) to connect to the piezoelectric layer 20 and to provide a connection to the extension 58. The extension 58 may connect, for example, to a main PCB as noted above. In this embodiment, FPC layer 18 may connect directly to piezoelectric layer 20 or may be connected to the piezoelectric layer 20 through the main PCB.

The connections to and from the FPC layer 18 may be by other means such as by one or many separate connectors.

The piezoelectric layer 20 in this embodiment comprises a metal plate 60. On the backside of the metal plate 60, of this embodiment, there are three piezoelectric components 62. The piezoelectric components 62 may be, for example, ceramic components, but other forms, shapes, numbers and orientations of piezoelectric components may be used. In one embodiment, the piezoelectric components 62 are constructed of a metal disk with a layer of voltage sensitive ceramic on one side. The other side of the metal disk has no ceramic. Other piezoelectric elements may also be used.

Figure 2A:
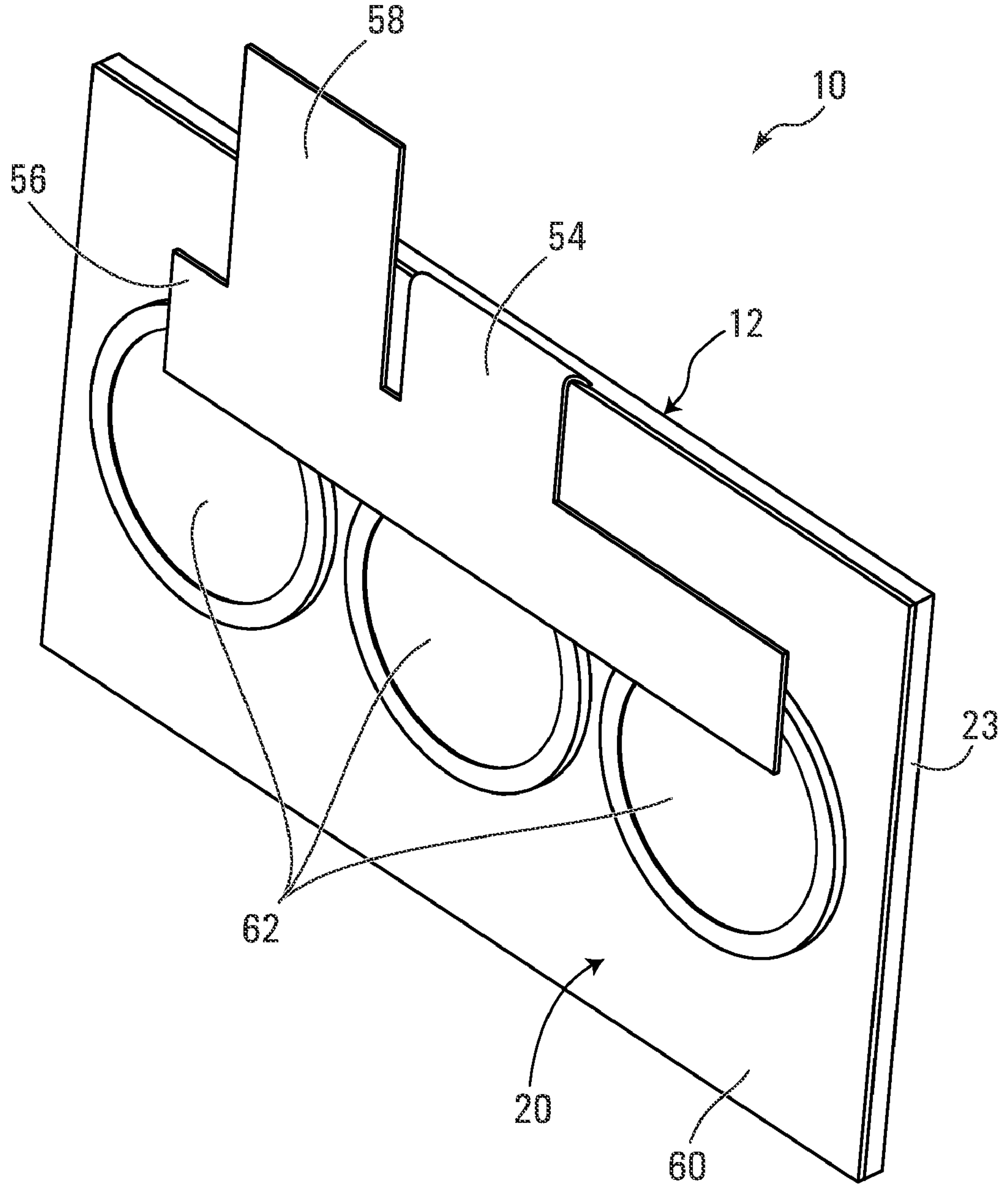
FIG. 2A is a bottom perspective view of the keypad structure of FIG. 1A.
Figure 3:
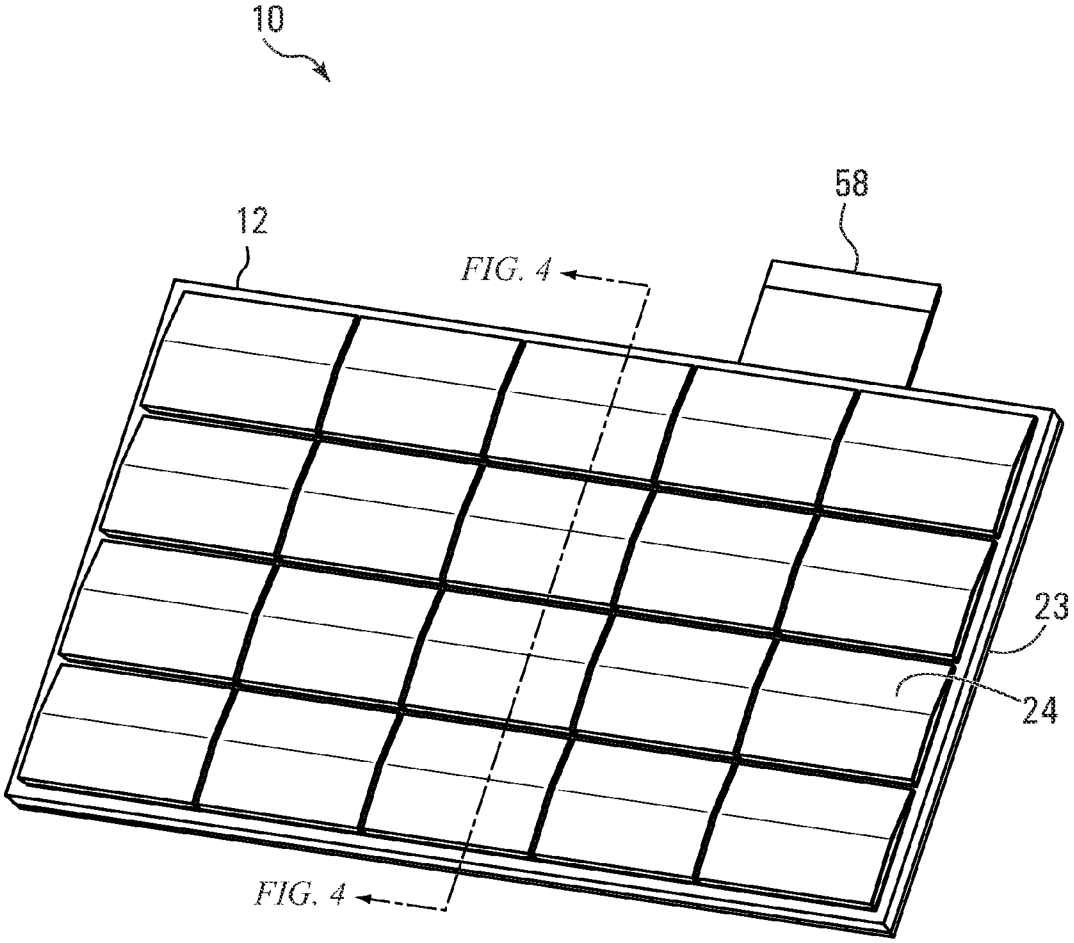
FIG. 3 is a top perspective view of the keypad structure of FIG. 1A.

Turning to FIGS. 2A and 3, the keypad structure 10 is shown assembled. FIG. 3 shows the array of hard keycaps 24, the flange 23 and the extension 58. From the rear view in FIG. 2A, it can be seen that the lightguide layer 14, the dome layer 16 and the FPC layer 18 fit within a recess defined in the back of the keypad layer 12 by the flange 23 which encircles the rear of the film style keypad sheet 22. The piezoelectric layer 20 provides a rear face for the keypad structure 10.

In FIG. 2A, it can be seen that the arm 56 of the connection portion 54 of the FPC layer 18 folds and is connected to the piezoelectric components 62. The connection between the arm 56 and the piezoelectric components 62 may be made, for example, by hot bar soldering traces on the arm 56 to leads on the piezoelectric components, although other methods of connection may be appropriate, as known in the art. The extension 58 projects outwardly from the keypad structure 10 to interconnect with other elements of the electronic device. The piezoelectric layer 20 therefore forms a structural element, in particular, a back plate of the keypad structure 10.

Figure 2B:
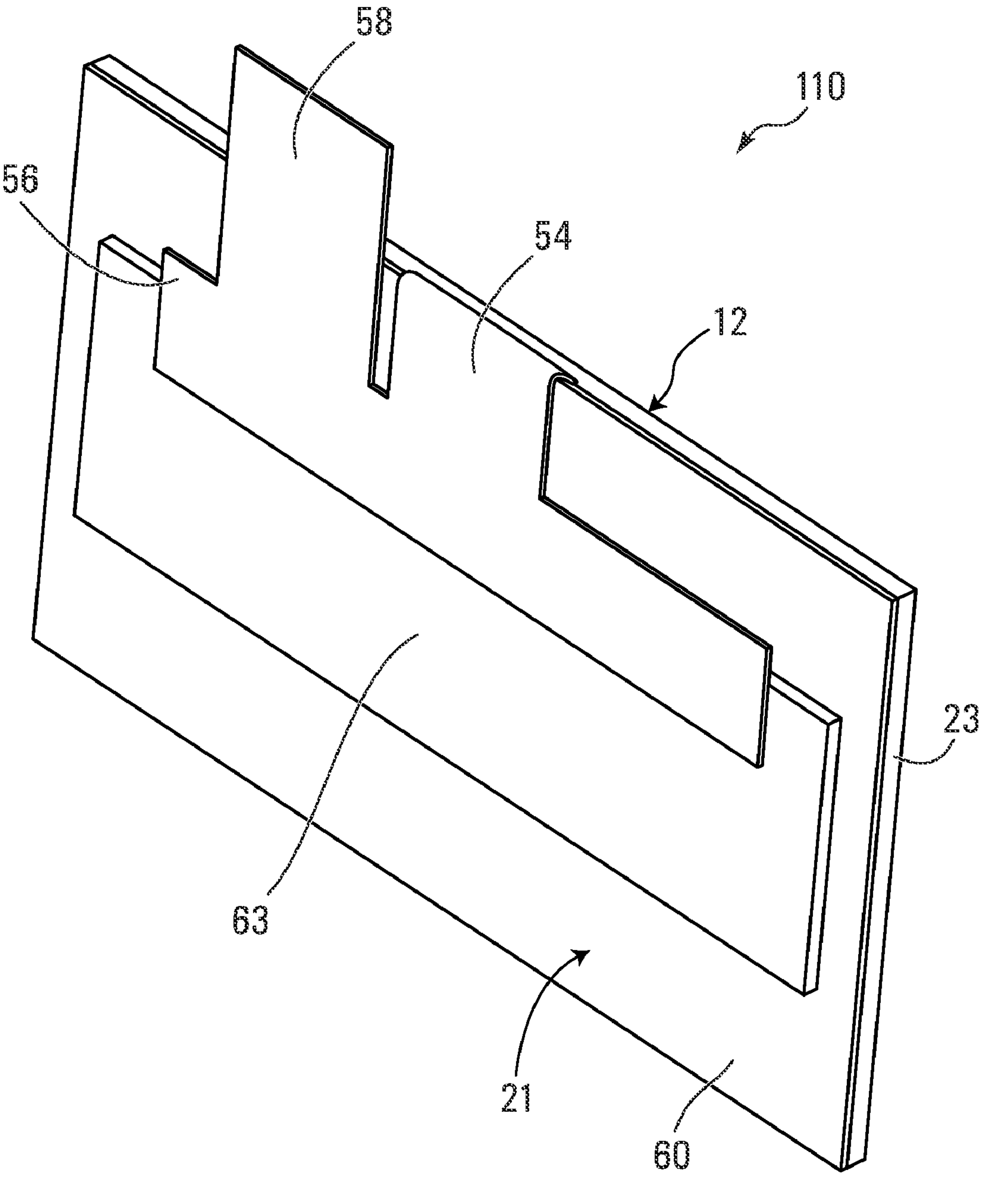
FIG. 2B is a bottom perspective view of a keypad structure according to another embodiment.

The piezoelectric layer 20 may be replaced by another vibratory element. For example, in FIG. 2B in a keypad structure 110 the piezoelectric layer 20 is replaced by a vibration motor layer 21. The vibration motor layer 21 comprises a vibration motor 63, such as an approximately 1.5-5V direct current (DC) vibration motor. The connection of the vibration motor 63 may also be made by hot bar soldering, although the present disclosure is not limited to such a connection method. The other elements shown in FIG. 2B are the same as those shown in FIG. 2A.

Figure 4:
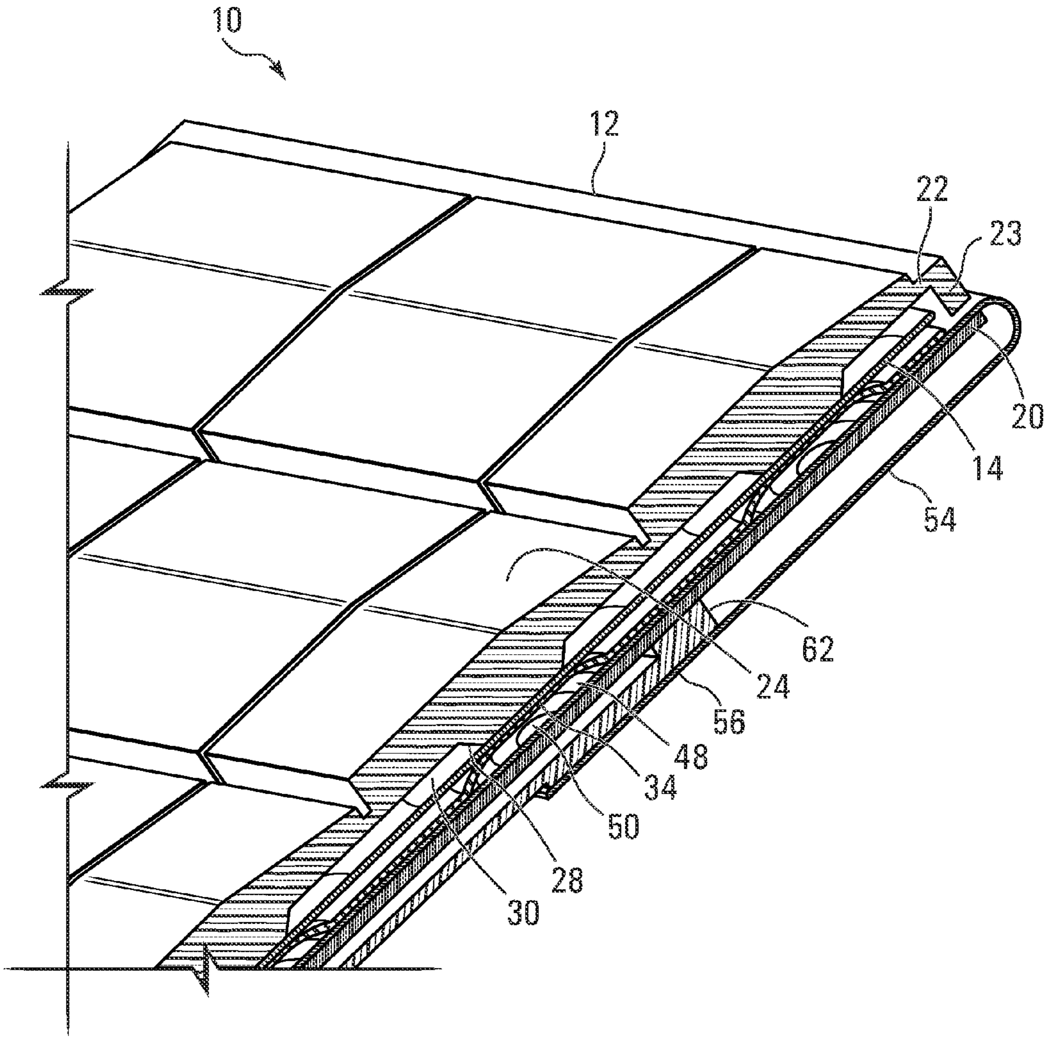
FIG. 4 is a partial perspective cross-sectional view of the keypad structure of FIG. 3 taken along line 4-4 of FIG. 3 and in the direction indicated.

FIG. 4 shows a partial cross sectional view of the keypad structure 10 when assembled. As previously noted, once assembled, the outer layers of the keypad structure 10 are the keypad layer 12 on the top and the piezoelectric layer 20 on the bottom. The keypad layer 12 includes the hard keycaps 24 and the film style keypad sheet 22. These elements together define actuators 28. Aligned under each of the actuators 28 are the micro-optical features 30 of the lightguide layer 14, the domes 34 of the dome layer 16 and the inner circles 50 and the outer rings 48 of the contact pads 44 of the FPC layer 20. The flange 23 of the keypad layer 12 is aligned with the outer edge of the piezoelectric layer 20 and may be connected thereto, for example, by an adhesive to seal the keypad structure 10.

The connection portion 54 of the FPC layer 18 extends out past the flange 23 and is wrapped around the rear of the keypad structure 18 to contact the piezoelectric components 62.

It will be appreciated that there is not a one to one correspondence between the piezoelectric component 62 and the dome switches. In some embodiments, all of the piezoelectric components 62 will be actuated when any of the dome switches is closed.

In other embodiments, the piezoelectric components 62 may be connected to a group of dome switches such that a piezoelectric component will be activated if any of a group of dome switches is closed. In other words, the three piezoelectric components 62 are first, second and third vibratory actuators. The dome switches are divided into three groups, each group being connected to the piezoelectric component 62 to which it is closest. This would, for example, allow the keypad structure 10 of the present embodiment to be divided into three zones and the piezoelectric components 62 to be selectively activated depending on the zone in which a corresponding dome switch is closed. The first of the piezoelectric components 62 would be actuated if any of the plurality of switches in the first zone is pressed, the second of the piezoelectric components 62 would be actuated if any of the plurality of switches in the second zone is pressed, and the third of the piezoelectric components 62 would be actuated if any of the plurality of switches in the third zone is pressed.

Figure 5:
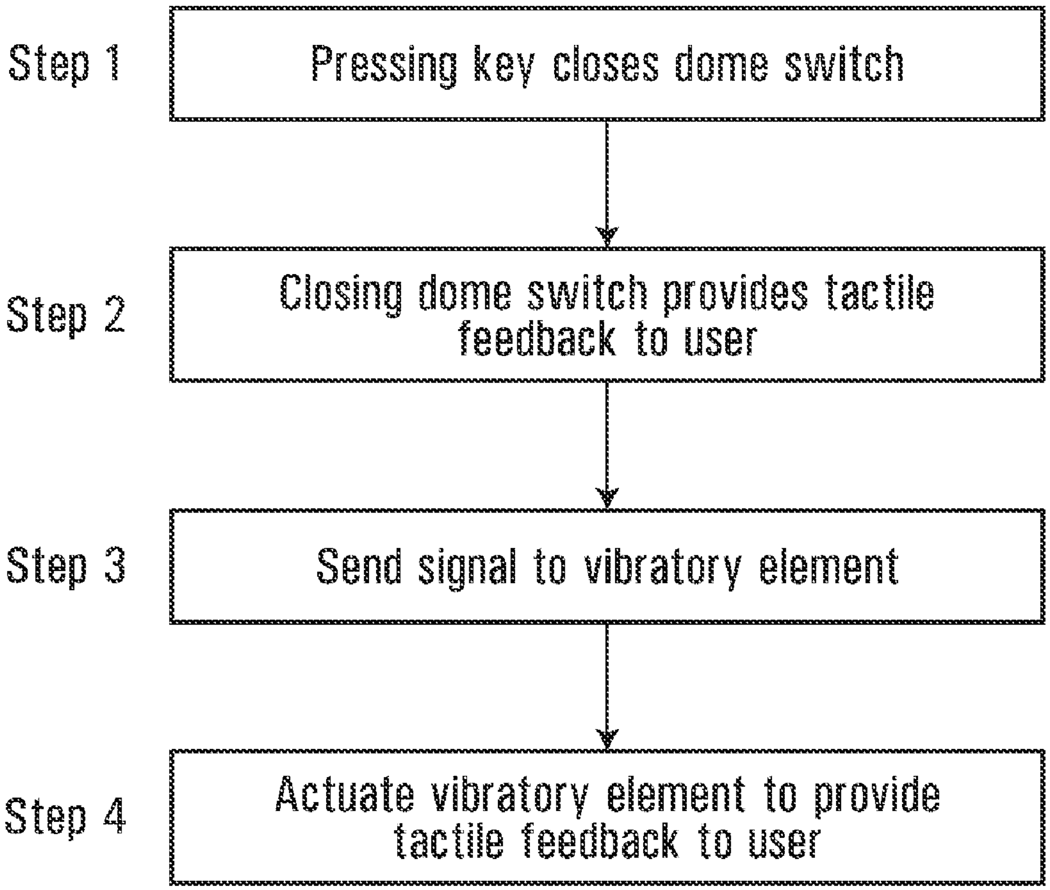
FIG. 5 is a flowchart of the operation of the keypad structure of FIG. 1A.

The operation of the keypad structure 10 of the present embodiment will be described with reference to the flowchart of FIG. 5. In Step 1, hard keycap 24 of the keypad layer 12 is pressed. As best can be seen in FIG. 4, the pressing of a hard keycap 24 will push the actuator 28 on the bottom of the key 24 against the lightguide layer 14. The lightguide layer 14 is flexible and the force will therefore be transmitted to the outer surface 36 of the aligned dome 34. The force will cause the flexible dome 34 to collapse. When the flexible dome 34 collapses, the conductive inner surface 38 of the dome 34 will connect the inner circle 50 of the contact pad 44 to the outer ring 48 of the contact pad 44. This completes the connection between the inner circle 50 and the outer ring 48 and thereby closes the dome switch.

In Step 2, the collapsing or flattening in the dome 34 may be felt by the user and provide a small tactile feedback to the user. However, the tactile feel provided by the dome 34, the first tactile feedback, may not strong enough for the user because of the mechanical limitations of dome 34 and film style keypad geometry and structure.

The closing of the dome switch causes a signal to be sent over the FPC layer 18 to the vibratory element, such as the piezoelectric layer 20, in Step 3. A signal may be sent either directly or through a main PCB. For example, 150V DC may be applied to the piezoelectric components 62 for approximately 20 milliseconds, then 0V DC may be applied to the piezoelectric components 62 for approximately 20 milliseconds, and then 150V DC may again be applied to the piezoelectric components 62 for approximately 20 milliseconds.

In step 4, the signal causes the vibrator element, such as the piezoelectric components 62, to actuate. For example, where the piezoelectric components 62 are constructed of a metal disk with a layer of voltage sensitive ceramic on one side, the application of the 150V DC will bend or bow the ceramic. When the voltage is repeatedly applied, the entire device will vibrate, giving the user a tactile feel. In an alternative embodiment, where the piezoelectric component is replaced by a DC vibration motor, the applied DC voltage will cause the vibration motor to rotate at approximately 3000~9000 r/minutes. This will cause the device to vibrate and provide the user with a second tactile feedback. The actuation of piezoelectric components 62 causes a vibration in the metal plate 60. This vibration from the metal plate 60 is felt by the user thus the user receives tactile feedback both from the feeling of the dome 34 collapsing when pressed and from the vibration of the piezoelectric component when a signal is sent to the piezoelectric component.

As noted above, in some embodiments, the keypad layer 12 and the lightguide layer 14 may be omitted such that the domes 34 are contacted directly by the user. The hard keycaps 24 may also be eliminated from the keypad layer 12 and the keypad layer 12 may consist simply of a film layer.

Although the embodiment in the Figures shows rectangular layers, the layers may be of any shape and any numbering and orientation of keys. The operation of the dome switches of the present embodiment provides an example. Other types of dome switches may alternatively be utilized.

The invention claimed is:

1. A keypad structure comprising:

a plurality of dome switches, each of the plurality of dome switches providing a first tactile feedback to a user when pressed; and at least one vibratory element aligned beneath and electrically connected to the plurality of dome switches and configured to actuate when any one of the plurality of dome switches is pressed, the at least one vibratory element providing a second tactile feedback to the user;

wherein the at least one vibratory element comprises a plate and at least one piezoelectric actuator;

wherein the plate comprises a structural component of the keypad structure; and wherein the structural component comprises a keypad back.

2. The keypad structure of claim 1 further comprising a second plurality of dome switches and at least one second vibratory element electrically connected to the second plurality of dome switches, wherein each of the second plurality of dome switches provides the first tactile feedback to the user when pressed; and wherein the at least one second vibratory element is configured to actuate when one of the second plurality of dome switches is pressed, the at least one second vibratory element providing the second tactile feedback to the user.

3. The keypad structure of claim 1 wherein the plurality of dome switches comprises a dome sheet and a circuit board and the circuit board interconnects the plurality of dome switches to the at least one vibratory element.

4. The keypad structure of claim 1 further comprising an input keypad surface connected to the plurality of dome switches.

5. The keypad structure of claim 4 wherein the input keypad surface comprises a film type keypad surface.

6. The keypad structure of claim 1 wherein the plate comprises a metal sheet and the at least one piezoelectric actuator comprises ceramic piezoelectric actuators.

7. A handheld electronic device comprising a keypad structure, the keypad structure comprising:

a plurality of dome switches, each of the plurality of dome switches providing a first tactile feedback to a user when pressed; and at least one vibratory element aligned beneath and electrically connected to the plurality of dome switches and configured to actuate when one of the plurality of dome switches is pressed, the at least one vibratory element providing a second tactile feedback to the user;

wherein the vibratory element comprises a plate and at least one piezoelectric actuator;

wherein the plate comprises a structural component of the keypad structure; and wherein the structural component comprises a keypad back.

8. The handheld electronic device of claim 7 wherein the keypad structure further comprises: a second plurality of dome switches, each of the second plurality of dome switches providing the first tactile feedback to the user when pressed; at least one second vibratory element electrically connected to the second plurality of dome switches and configured to actuate when one of the second plurality of dome switches is pressed, the at least one second vibratory element providing the second tactile feedback to the user.

9. A method of providing tactile feedback to a user of a keypad structure the keypad structure comprising a plurality of dome switches and at least one vibratory element aligned beneath and electrically connected to the plurality of dome switches, the at least one vibratory element comprising a plate and at least one piezoelectric actuator, the plate comprising a structural component of the keypad structure, the structural component comprising a keypad back, the method comprising:

providing a first tactile feedback to a user when each of a plurality of dome switches is pressed;

sending a signal to the at least one vibratory element; and actuating the at least one vibratory element upon receipt of the signal and providing a second tactile feedback to the user by vibration of the keypad back.

10. The method of claim 9 wherein the at least one vibratory element comprises at least one first vibratory element and at least one second vibratory element and the plurality of dome switches comprises a first plurality of dome switches and a second plurality of dome switches, the method further comprising sending the signal to the at least one first vibratory element to actuate when any of the first plurality of dome switches is pressed, and sending the signal to the at least one second vibratory element when any of the second plurality of dome switches is pressed.

11. The method of claim 9 wherein the plurality of dome switches comprises a dome sheet and a circuit board and the circuit board sends the signal from the dome switches to the at least one vibratory element.

12. The method of claim 9 wherein the tactile feedback is provided through an input keypad surface connected to the dome switches.

13. The method of claim 12 wherein the input keypad surface comprises a film type keypad surface.

14. The method of claim 9 wherein the plate comprises a metal sheet and the at least one piezoelectric actuator comprises ceramic piezoelectric actuators.

15. The keypad structure of claim 1 further comprising a keypad layer wherein the keypad layer and the plate are connected and comprise outer layers of the keypad structure.

16. The handheld electronic device of claim 7 further comprising a keypad layer wherein the keypad layer and the plate are connected and comprise outer layers of the keypad structure.

17. The method of claim 9 wherein the keypad structure further comprises a keypad layer and wherein the keypad layer and the plate are connected and comprise outer layers of the keypad structure.

* * * * *